a screenshot of a patent cover page
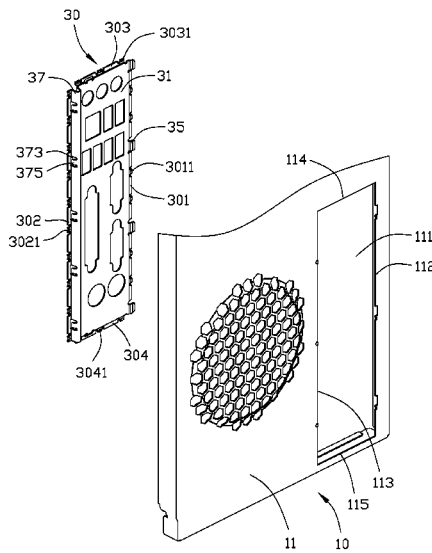

COMPUTER ENCLOSURE WITH SHIELDING COVER

BACKGROUND

1. Technical Field

The present disclosure relates to computer enclosures, and particularly to a computer with a shielding cover.

2. Description of Related Art

A computer enclosure includes a rear wall. The rear wall defines an opening. An input/output (I/O) shielding cover is usually provided to cover the opening of the rear wall. Conventionally, the I/O shielding cover is usually secured on the rear wall with screws or rivets. However, it is very inconvenient to assemble or disassemble the I/O shielding cover.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
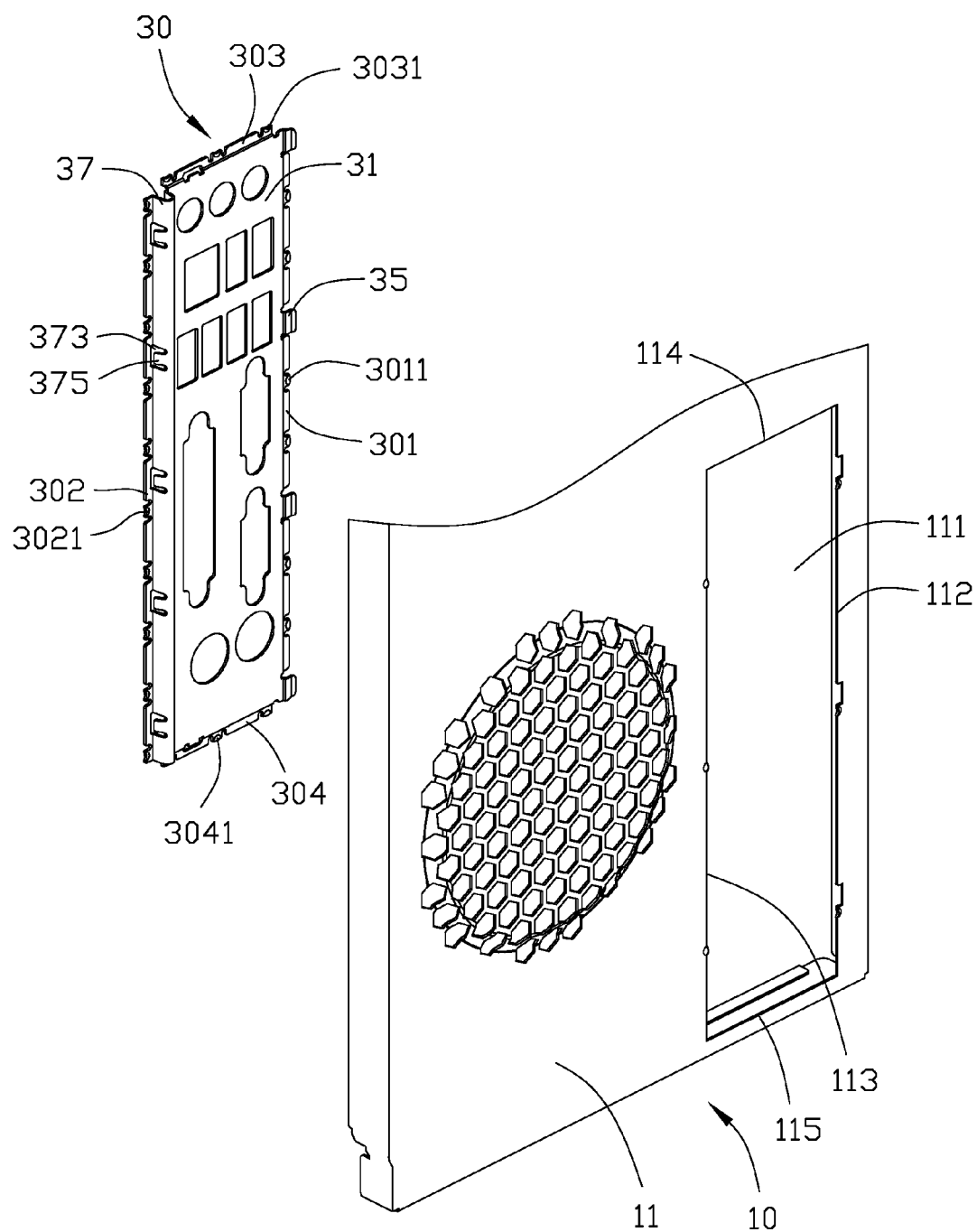
FIG. 1 is an exploded, isometric, cutaway view of one embodiment of a computer enclosure.
Figure 2:
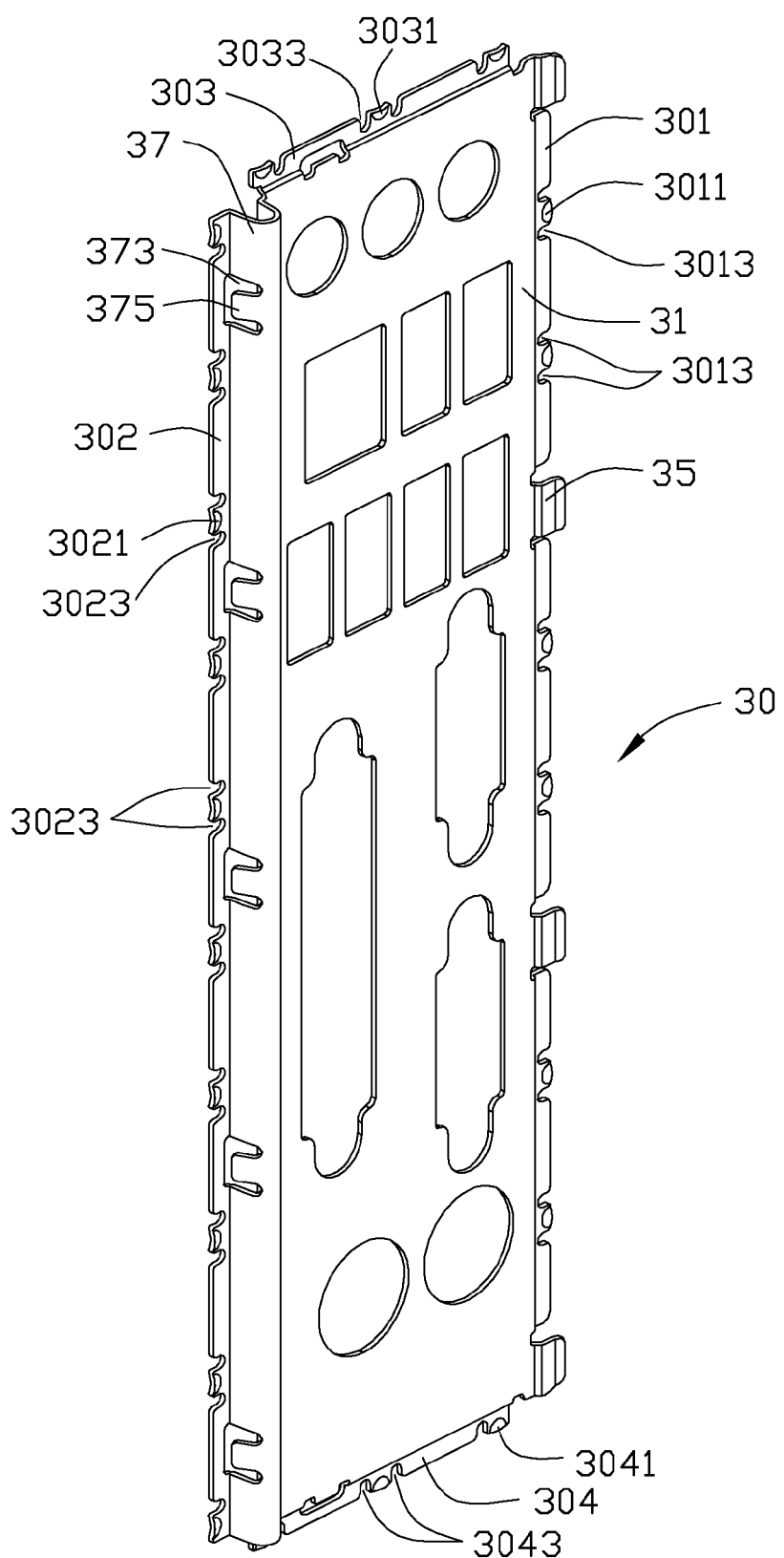
FIG. 2 is another isometric view of a shielding cover of FIG. 1.

Referring to FIG. 1, a computer enclosure in accordance with an embodiment includes a chassis 10 and a shielding cover 30 detachably secured to the chassis 10.

Figure 3:
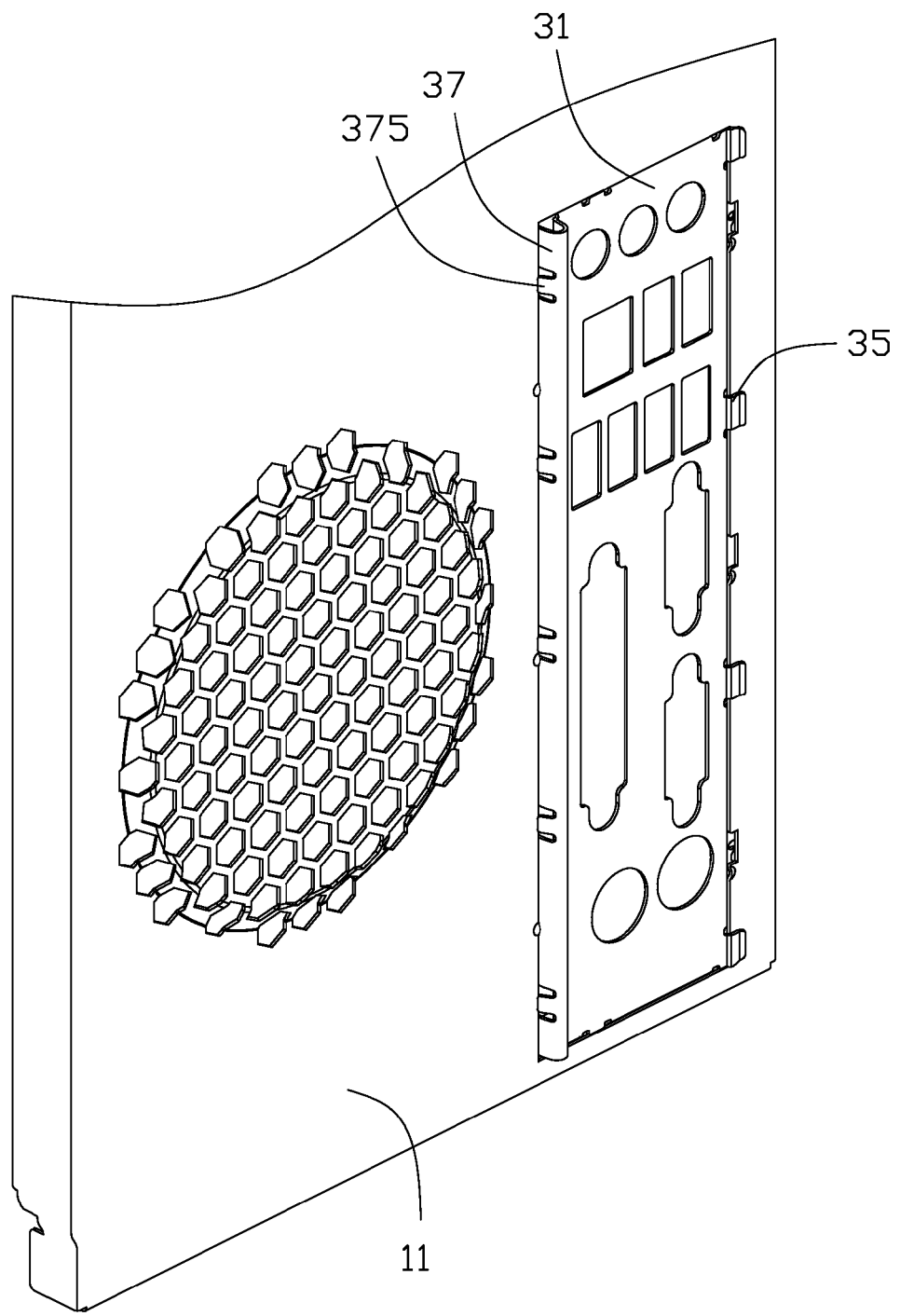
FIG. 3 is an assembled view of the computer enclosure shown in FIG. 1.
Figure 4:
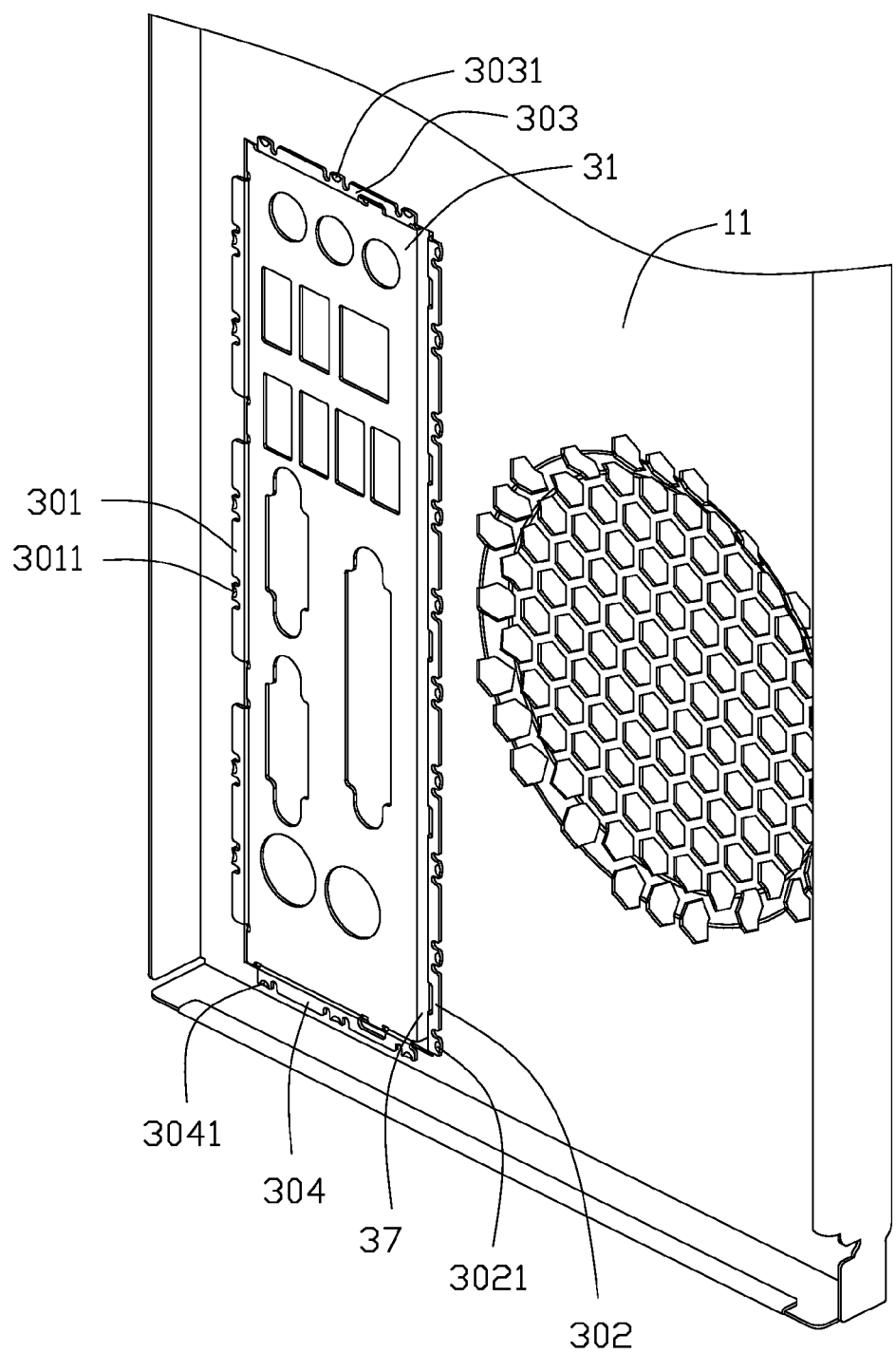
FIG. 4 is similar to FIG. 3, but viewed from another aspect.

The chassis 10 is capable of accommodating electronic elements therein. The electronic elements, may include, but not limited to, a motherboard, a hard disk drive, and a power supply. The chassis 10 includes a rear panel 11. In FIGS. 1, and 3-4 of one embodiment, only the rear panel 11 is shown. A through opening 111 is defined in the rear panel 11. In one embodiment, the through opening 111 is rectangular. The through opening 111 has a first edge 112, a second edge 113, a third edge 114, and a fourth edge 115. In one embodiment, the first edge 112 has a length substantially the same as the second edge 113. The third edge 114 also has a substantially length same to the fourth edge 115, but shorter than the length of the first and second edges 112, 113.

The shielding cover 30 is removably coupled to the rear panel 11 to cover the through opening 111, so as to improve Electro Magnetic Interference (EMI) shielding of the computer enclosure. In one embodiment, the shielding cover 30 is substantially rectangular. The shielding cover 30 includes a base body 31, a first flange 301, a second flange 302, a third flange 303, and a fourth flange 304. The base body 31 defines a plurality of connector slots. The connector slots are configured to receive connectors. For example, the connectors may be Universal Serial Bus connectors, monitor connectors, mouse connectors, keyboard connectors, etc. In one embodiment, the first flange 301 has a length substantially equal to that of the second flange 302 and the first and second edges 112, 113 of the through opening 111; the third flange 303 has a substantially length equal to that of the fourth flange 304 and the third and fourth edges 114, 115 of the through opening 111. A plurality of clips 35 are located on the first flange 301. The plurality of clips 35 and the first flange 301 form a clamping space capable of receiving the first edge 112 of the through opening 111. A plurality of first protrusions 3011 are located on the first flange 301 and abut the rear panel 11 when the first edge 112 is held in the clamping space. Two first cutouts 3013 defined in the first flange 301 at two opposite sides of each of the plurality of first protrusions 3011. A plurality of second protrusions 3021 are located on the second flange 302 and engaged with the rear panel 11 when the shielding cover 30 is secured to the rear panel 11. Two second cutouts 3023 are defined in the second flange 302 at two opposite sides of each of the plurality of second protrusions 3021. The second flange 302 is connected to the base body 31 via a resilient portion 37. In one embodiment, the resilient portion 37 is U-shaped bend. The resilient portion 37 defines a plurality of through slots 373. A plurality of resilient tabs 375 are located on the resilient portion 37, and each of the plurality of resilient tabs 375 extends from an edge of the through slot 373. The plurality of resilient tabs 375 and the second flange 302 are capable of clipping the second edge 113 of the through opening 111. A plurality of third protrusions 3031 are located on the third flange 303, and a plurality of fourth protrusions 3041 are located on the fourth flange 304. Two third cutouts 3033 are defined in the third flange 303 at two opposite sides of one of the plurality of first protrusions 3031, and two fourth cutouts 3043 are defined in the second flange 304 at two opposite sides of one of the plurality of second protrusions 3041. The third and fourth protrusions 3031, 3041 engage with the rear panel 11 when the shielding cover 30 is secured to the rear panel 11.

Referring also to FIGS. 3-4, in assembly, the first edge 112 of the through opening 111 of the rear panel 11 is received between the clips 35 and the first flange 301 of the shielding cover 30. The shielding cover 30 is pivotally rotated about engagement of the shielding cover 30 and the rear panel 11 to insert the resilient portion 37 in the through opening 111, until the plurality of positioning tabs 375 abut the second edge 113 of the through opening 111. The shielding cover 30 is further rotated so that the resilient portion 37 and/or the plurality of positioning tabs 375 are resiliently deformed because of the engagement with the second edge 113. When the plurality of positioning tabs 375 are moved cross the second edge 113, the resilient portion 37 and/or the plurality of positioning tabs 375 returns to normal to together with the second flange 302 which is engaged with the second edge 113 between the plurality of positioning tabs 375 and the second flange 302. The first, second, third, and fourth protrusions 3011, 3021, 3031, 3041 abut on the rear panel 11. Thus, the shielding cover 30 is secured on the rear panel 11 and covers the through opening 111.

In disassembly, the resilient portion 37 is resiliently deformed to disengage the positioning tabs 375 from the second edge 113, so that the positioning tabs 375 do not block the shielding cover 30 from moving out of the through opening 111. As a result, the shielding cover 30 is disengaged from the second edge 113 of the through opening 111 firstly and then removed from the through opening 111. Thus, the shielding cover 30 is removed from the rear panel 11.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A computer enclosure comprising:
a rear panel defining a through opening therein, the through opening comprising a first edge and a second edge opposite to the first edge; and
a shielding cover, capable of covering the through opening, comprising a base body, a resilient portion, and first and second flanges located on opposite edges; a clip being located on the first flange, the resilient portion connecting the second flange and the base body, a positioning tab being located on the resilient portion;
wherein the first edge of the through opening is engageable between the clip and the first flange, and the second edge of the through opening is engageable between the tab and the second flange; the resilient portion is resiliently deformable to disengage the second edge of the through opening from between the second flange and the tab;
a plurality of first protrusions located on the first flange, the plurality of first protrusions abutting the rear panel when the first edge of the through opening is engaged in between the clip and the first flange;
a plurality of second protrusions located on the second flange, the plurality of second protrusions abutting the rear panel when the second edge of the through opening is engaged in between the tab and the second flange;
two first cutouts defined in the first flange at two opposite sides of each of the plurality of first protrusions, and two second cutouts defined in the second flange at two opposite sides of each of the plurality of second protrusions.

2. The computer enclosure of claim 1, wherein the resilient portion is U-shaped bend.

3. The computer enclosure of claim 1, wherein the resilient portion defines a through slot therein, and the positioning tab extends from an edge of the through slot.

4. A computer enclosure comprising:
a rear panel defining a through opening therein, the through opening comprising a first edge and a second edge opposite to the first edge; and
a shielding cover, capable of covering the through opening, comprising a base body, a resilient portion, first and second flanges, a clip, and a tab; the first flange and the clip being located on the base body opposite to the second flange and the tab; the resilient portion connecting the second flange and the base body;
wherein the first edge of the through opening is engageable between the clip and the first flange; the tab has a first position, where the second edge of the through opening is engaged in between the second flange and the tab, and a second position, where the resilient portion is resiliently deformed to disengage the second edge of the through opening from between the second flange and the tab;
a plurality of first protrusions located on the first flange, the plurality of first protrusions abutting the rear panel when the first edge of the through opening is engaged in between the clip and the first flange;
a plurality of second protrusions located on the second flange, the plurality of second protrusions abutting the rear panel when the second edge of the through opening is engaged in between the tab and the second flange;
two first cutouts defined in the first flange at two opposite sides of each of the plurality of first protrusions, and two second cutouts defined in the second flange at two opposite sides of each of the plurality of second protrusions.

5. The computer enclosure of claim 4, wherein the resilient portion is U-shaped bend.

6. The computer enclosure of claim 4, wherein the resilient portion defines a through slot therein, and the positioning tab extends from an edge of the through slot.

7. The computer enclosure of claim 4, wherein the clip is located on the first flange.

8. The computer enclosure of claim 4, wherein the shielding cover is rotated about engagement of the shielding cover to insert the resilient portion in the through opening when the shielding cover is rotated from the second position to the first position.

* * * * *